US006891443B2

(12) United States Patent
Rashid

(10) Patent No.: US 6,891,443 B2
(45) Date of Patent: May 10, 2005

(54) OSCILLATOR

(75) Inventor: Tahir Rashid, Harrow (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/944,637

(22) Filed: Aug. 31, 2001

(65) Prior Publication Data

US 2002/0075083 A1 Jun. 20, 2002

(30) Foreign Application Priority Data

Sep. 1, 2000 (GB) .............................................. 0021541

(51) Int. Cl.$^7$ .............................................. H03K 3/26
(52) U.S. Cl. ........................ 331/111; 331/143; 331/176
(58) Field of Search ............................ 331/57, 34, 143, 331/176, 185, 179, 153, 111

(56) References Cited

U.S. PATENT DOCUMENTS

| | | | |
|---|---|---|---|
| 4,323,861 A | | 4/1982 | Sandler et al. .............. 331/111 |
| 4,594,565 A | | 6/1986 | Barreras |
| 5,508,664 A | * | 4/1996 | Rizzo .......................... 331/111 |
| 5,739,728 A | * | 4/1998 | Kim ............................ 331/111 |
| 5,801,982 A | * | 9/1998 | Blodgett ..................... 365/149 |
| 5,870,000 A | * | 2/1999 | Matsuda et al. ............... 331/34 |
| 5,870,345 A | * | 2/1999 | Stecker ....................... 365/222 |
| 5,889,441 A | * | 3/1999 | Inn ............................ 331/143 |
| 5,912,593 A | * | 6/1999 | Susak et al. ................ 331/111 |
| 6,005,449 A | * | 12/1999 | Oberlin ....................... 331/140 |
| 6,157,270 A | * | 12/2000 | Tso ............................ 331/176 |
| 6,271,735 B1 | * | 8/2001 | Halamik et al. ............. 331/111 |
| 6,456,170 B1 | * | 9/2002 | Segawa et al. .............. 331/143 |
| 6,515,551 B1 | | 2/2003 | Mar et al. ................... 331/111 |

FOREIGN PATENT DOCUMENTS

| | | |
|---|---|---|
| EP | 0735677 A1 | 10/1996 |
| FR | 2778514 A1 | 11/1999 |
| FR | 2 783 372 A | 3/2000 |
| JP | 050327428 A | 12/1993 |

OTHER PUBLICATIONS

Standard Search Report from priority application No. 106925.
Application Note an 170 *NE555 and NE556 Applications*, Dec. 1988, Philips Semiconductors XP002169882.
United Kingdom Search Report from patent application No. GB0021541.8, filed Sep. 1, 2000.
United Kingdom Examination Report under Section 18(3) dated Nov. 24, 2003.
Standard Search Report from priority application No. 106925, Jun. 18, 2001.
Application Note an 170 *NE555 and NE556 Applications*, Dec. 1988, Philips Semiconductors XP002169882.

* cited by examiner

Primary Examiner—Michael Tokar
Assistant Examiner—Linh V Nguyen
(74) Attorney, Agent, or Firm—Lisa K. Jorgenson; James H. Morris; Wolf, Greenfield & Sacks, P.C.

(57) ABSTRACT

An oscillator circuit is described comprising of a capacitor; a capacitor charging means arranged to supply a current to charge the capacitor to a first predetermined threshold voltage; a capacitor discharging means arranged to discharge the capacitor to a second predetermined threshold voltage; and a switching means arranged to switch between a capacitor discharging mode and a capacitor charging mode. The switching means is responsive to the capacitor reaching at least one of said threshold voltages. Furthermore at least one threshold voltage is determined by a threshold setting means, which provides a voltage threshold that varies to compensate for changes in temperature.

27 Claims, 2 Drawing Sheets

OSCILLATOR

FIELD OF THE INVENTION

This invention relates to oscillator circuits and particularly to temperature compensated oscillator circuits.

BACKGROUND OF THE INVENTION

A problem with many known types of oscillator circuit is that variations in temperature cause changes in the oscillation frequency. In some cases the oscillation frequency can increase with temperature, whereas in other cases the oscillation frequency can decrease with temperature For example, consider oscillator circuits which rely on repeated charging and discharging cycles of a capacitor to generate an oscillating voltage signal. A problem with such oscillator circuits can be that the rate of current flow on and off the capacitor C increases with increasing temperature As a result, the capacitor charges and discharges faster at high temperatures and thus reaches respective upper and lower voltage limits in less time. This means that the frequency of the oscillating signal increases with temperature and hence such oscillators are unreliable in timing applications.

SUMMARY OF THE INVENTION

Embodiments of the present invention seek to provide oscillator circuits having improved temperature characteristics.

According to a first aspect of the present invention, there is provided oscillator circuitry comprising a capacitor; capacitor charging means arranged to supply a current to charge the capacitor to a first predetermined threshold voltage; capacitor discharging means arranged to discharge the capacitor to a second predetermined threshold voltage; and switching means arranged to switch between a capacitor discharging mode and a capacitor charging mode responsive to reaching at least one of said threshold voltages, wherein the at least one threshold voltage is determined by a threshold setting means which provides a voltage threshold which varies to compensate for changes in temperature.

Preferably, the threshold setting means comprises a current source and a resistive means which varies in resistance in dependence upon temperature.

In preferred embodiments, the switching means comprises a comparator arranged to monitor voltage across the capacitor and to trigger a change between the discharging and charging modes.

In such case, the comparator is connected to a first control transistor which sets the first and second predetermined threshold voltages of the capacitor The first control transistor may be arranged to selectively by-pass an element of a resistive chain.

Preferably, the comparator is also connected to a second control transistor which controls current flow to facilitate charging and discharging of the capacitor means.

Typically, the resistive means comprises one or more diode-connected transistors.

Each said capacitor charging means comprising a current source and preferably an IPTAT current source. Preferably, each said capacitor discharging means comprises a current source of the same type.

BRIEF DESCRIPTION OF THE DRAWINGS

Embodiments of the present invention will now be described by way of example only with reference to the accompanying drawings in which.

DESCRIPTION OF PREFERRED EMBODIMENTS OF THE PRESENT INVENTION

Figure 1:
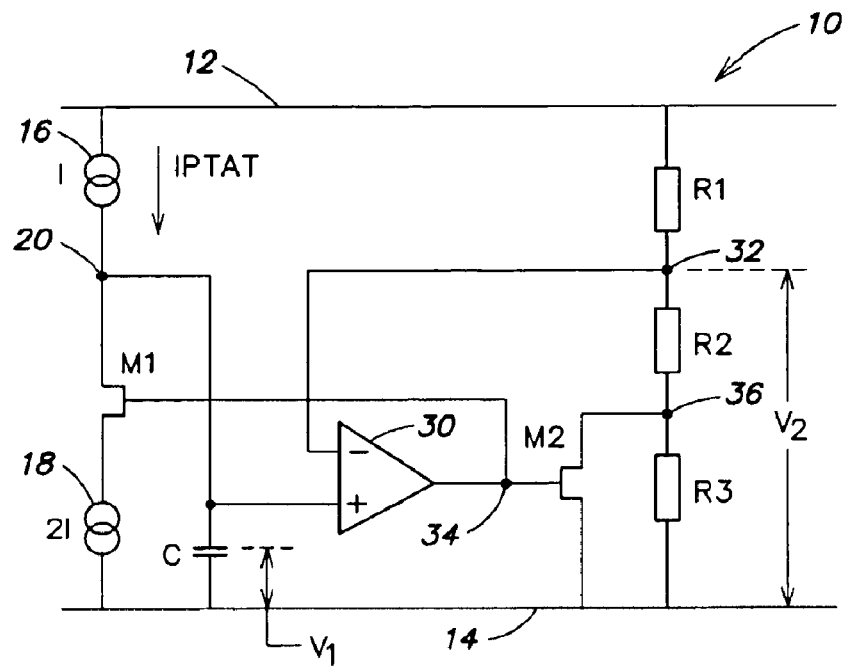
FIG. 1 shows a first embodiment of an oscillator circuit.

One type of oscillator circuit 10 is shown in FIG. 1. The oscillator circuit 10 comprises a first power supply rail 12 and a second power supply rail 14. A first current source 16 is connected between the first power supply rail 12 and a first transistor M1 to generate IPTAT, a current proportional to absolute temperature. The transistor M1 has its controllable path connected between the first current source 16 and a second IPTAT current source 18 which is itself connected to the second power supply rail 14. The first current source 16, the transistor M1 and the second current source 18 are connected in series between the first power supply rail 12 and the second power supply rail 14.

A capacitor C has a first terminal connected to a node 20 between the first current source 16 and the transistor M1. The second terminal of the capacitor C is connected to the second power supply rail 14. A comparator 30 is disposed in the circuit 10 so as to comprise a switching device. The comparator 30 has a first (positive) input connected to the first terminal of the capacitor C and the node 20 between the first current source 16 and the transistor M1. A second (negative) input of the comparator 30 is connected to a node 32 of a resistive chain comprising first, second and third resistors $R_1$, $R_2$ and $R_3$. The resistors $R_1$, $R_2$ and $R_3$ are connected in series between the first power supply rail 12 and the second power supply rail 14. The node 32 to which the second input of the comparator 30 is connected is at the junction between the first resistor $R_1$ and the second resistor $R_2$ of the resistive chain $R_1$, $R_2$ and $R_3$.

The output 34 of the comparator 30 is supplied to the control terminal of a further transistor M2 which has its controllable path connected between the second power supply rail 14 and a node 36 between the second resistor $R_2$ and the third resistor $R_3$ of the resistive chain $R_1$, $R_2$ and $R_3$. The output 34 of the comparator 30 is also supplied to the control terminal of the first transistor M1. The first and second transistors M1 and M2 are thus both controlled by the output signal of the comparator 30.

In the above circuit there are two current sources 16,18. The first current source 16 produces the current I and the second current source 18 produces the current 2I. In the charging phase of the capacitor, the transistors M1 and M2 are turned off. With the transistor M1 in an off state, the current I from the first current source 16 is supplied to the first terminal of the capacitor C. The voltage $V_1$ on the capacitor C (i.e. the voltage on the first terminal of the capacitor referred to the second supply rail) rises until it reaches the voltage $V_2$ of the junction between the first and second resistors $R_1$ and $R_2$ referred to the second supply rail 14.

When the voltage $V_1$ on the capacitor C reaches the voltage $V_2$ at the node 32, the transistors M1 and M2 are turned on. With the transistor M1 turned on, the capacitor C enters its discharging phase. The capacitor C is discharged by a predetermined amount. Since the conducting transistor M2 bypasses (shorts) the third resistor R3, the voltage $V_2$ at the node 32 referred to the power supply rail 14 is reduced to a lower voltage. The capacitor C discharges until a lower threshold is reached at which point in time the comparator switches back thereby turning off the transistors M1 and M2 to begin the charging cycle again.

Thus the capacitor C is charged by the first current source 16 until an upper threshold voltage close to the supply voltage is reached. The current supply to the capacitor is then "reversed", such that the capacitor C is discharged until a lower threshold voltage close to zero volts is reached. The current supply is "reversed" again and the cycle repeated. Repeat cycles of charging and discharging the capacitor C produce voltage oscillations on the capacitor referred to the second power supply rail 14. The voltage across the capacitor plates represents a substantially triangular waveform over time. A square wave for example for use in timing applications can be produced from the triangular wave by taking the output of an inverter having its input connected to the capacitor or the output of the comparator.

Figure 2:
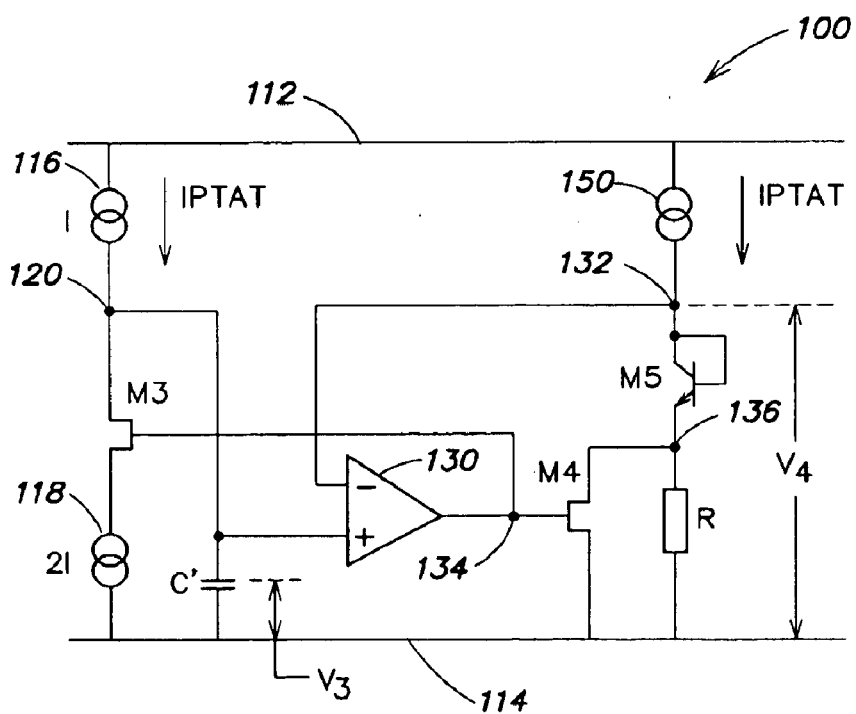
FIG. 2 shows another oscillator circuit embodying the present invention.

FIG. 2 shows an oscillator circuit 100 in accordance with an embodiment of the invention which is capable of generating an output signal having a frequency which is substantially independent of temperature variations. The oscillator circuit 100 comprises a first power supply rail 112 and a second power supply rail 114. A first IPTAT current source 116 is connected between the first power supply rail 112 and a first transistor M3. The transistor M3 has its controllable path connected between the first current source 116 and a second IPTAT current source 118 which is itself connected to the second power supply rail 114. The first current source 116, the transistor M3 and the second current source 118 are connected in series between the first power supply rail 112 and the second power supply rail 114.

A capacitor C' has a first terminal connected to a node 120 between the first current source 116 and the transistor M3. A second terminal of the capacitor C is connected to the second power supply rail 114. A comparator 130 is disposed in the circuit 100 so as to comprise a switching device. The comparator 130 has a first (positive) input connected to the first terminal of the capacitor C' and true node 120 at the junction between the first current source 116 and the transistor M3. A second (negative) input of the comparator 130 is connected to a node 132 of a component chain comprising in series a third IPTAT current source 150, a diode-connected transistor M5 and a resistor R. The third current source 150 is connected between the first power supply rail 112 and the diode-connected transistor M5. The resistor R is connected between the diode-connected transistor M5 and the second power supply rail 114. The node 132 to which the second input of the comparator 130 is connected is at the junction between the third current source 150 and the diode-connected transistor M5.

The output 134 of the comparator 130 is supplied to the control terminal of a transistor M4 which has its controllable path connected between the second power supply rail 114 and a node 136 at the junction between the diode-connected transistor M5 and the resistor R. The output 134 of the comparator 130 is also supplied to the control terminal of the first transistor M3. The first and second transistors M3 and M4 are controlled by the output signal 134 of the comparator as will be explained below.

In use, the capacitor C' is charged and discharged by the first and second current sources 116 and 118, respectively. The first current source 116 produces the current I. In the charging phase the transistors M3 and M4 are both turned off. With the transistor M3 turned off, the current I from the first current source 116 is supplied to the first terminal of the capacitor C. As the charge on the plate of the capacitor C' accumulates, the voltage $V_3$ across the capacitor increases until it reaches the voltage $V_4$ between the function 132 and the second power supply rail 114. With the transistor M4 turned off the voltage $V_4$ depends on the resistance of the circuit branch containing the diode-connected transistor M5 and the resistor R. That is, in the charging phase the upper voltage threshold of the capacitor is determined by the voltage across the series combination of the diode-connected transistor M5 and the resistor R.

When the voltage $V_3$ across the capacitor C' reaches that between the node 132 and the second power supply rail 114, the output of the comparator 130 changes state. The change in the state of the output of the comparator 130 is effective to switch the transistors M3 and M4 on. When the transistor M3 is turned on the capacitor C' enters its discharging phase. The capacitor C' is discharged by a predetermined amount. For example, the second current source 118 passes a current 2I and the first current source passes a current I, the capacitor is discharged by an amount I (where I=2I−I). That is, the voltage $V_3$ across the plates capacitor C' is reduced to a lower threshold voltage determined by the voltage $V_4$ at node 132 referred to the second power supply rail 114. The voltage $V_4$ at the node 132 is dependent only upon the resistance of the diode-connected transistor M5 since the transistor M4 is now turned on and defines a lower resistance pathway between the second power supply rail 114 and the diode-connected transistor M5.

When the capacitor C' is discharged to the extent that this lower voltage threshold is reached the output of the comparator changes state again and the transistors M3 and M4 are switched back to their off states to begin the charging cycle again. The above described charging and discharging phases are repeated many times to generate an oscillating triangular waveform. The oscillating triangular waveform is converted to a square waveform by taking the output of an inverter having its input connected to the capacitor.

Figure 3:
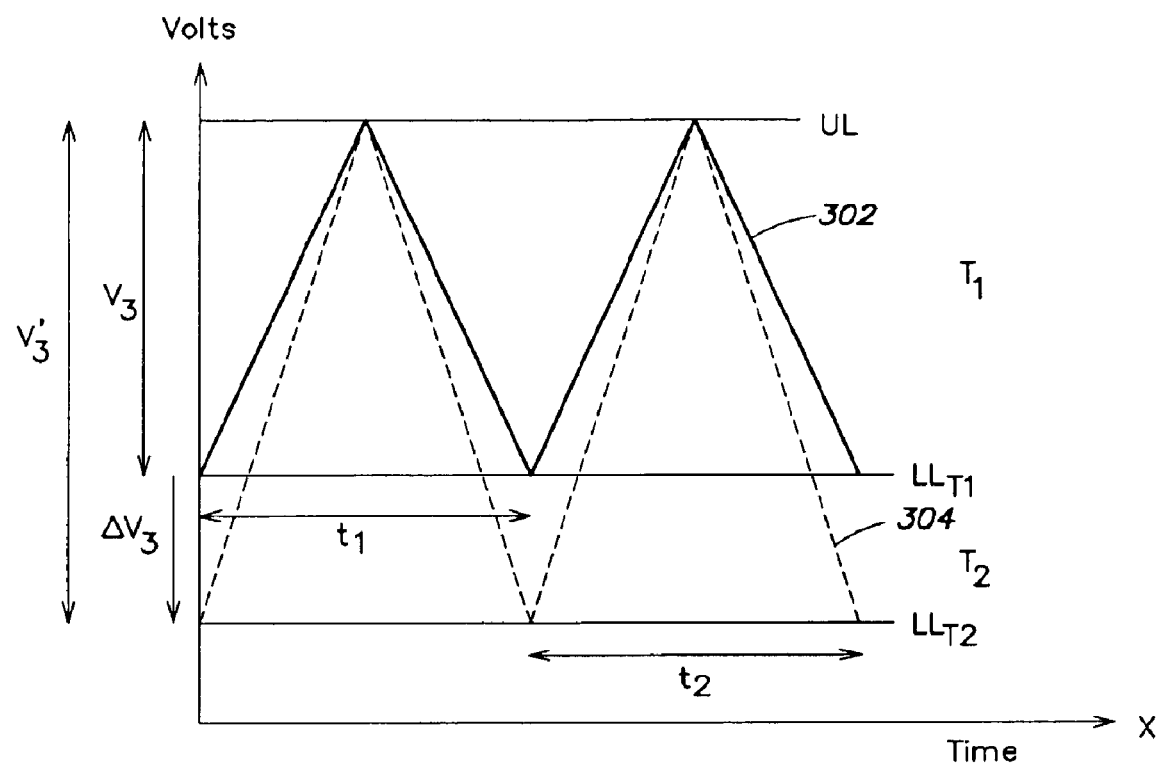
FIG. 3 shows the variation of output voltage over time for the oscillator of FIG. 2 at two different temperatures.

FIG. 3 illustrates how the capacitor voltage generated by the embodiment of FIG. 2 varies with time at two different temperatures. Voltage increases along the y-axis is and the time along the X-axis. The solid triangular wave 302 represents the voltage $V_3$ across the capacitor plates at a first temperature T1. The broken triangular waveform 304 represents the voltage $V_3$ across the capacitor plates at a temperature $T_2$ which is higher than the first temperature T1. (i.e. $T_2 \leq T_1$).

At the lower temperature T1, the voltage $V_3$ across the plates of the capacitor C' oscillates between an upper limit UL and a lower limit $LL_{T1}$. The upper UL is defined during the charging phases of the capacitor C by the voltage across the series combination of the diode-connected transistor M5 and the resistor R. The lower limit $LL_{T1}$ is defined during the discharging phases of the capacitor C' by the voltage across the diode-corrected transistor M5 only. The result of continuous oscillation between these upper and lower limits UL, $LL_{T1}$ is a substantially triangular waveform having a trough-to-trough period of $t_1$ and thus a frequency of $1/t_1$.

At the higher temperature $T_2$ the voltage on the capacitor C' oscillates between the same upper limit UL and a lower limit $LLT_2$. The upper limit UL is defined in the charging phase of the capacitor C' in the same way as above. As temperature increases the charging and discharging currents increase and hence the capacitor charges and discharges to its upper and lower threshold voltages at a greater rate. This is demonstrated by the steeper gradients of the waveform designated by reference numeral 304 compared with the gradients of the waveform 302 on FIG. 3. The lower voltage threshold during the discharging phase of a capacitor C' in a circuit such as that shown in FIG. 2 is dependent on the resistance of the diode-connected transistor. The lower voltage threshold $LL_{T2}$ at temperature $T_2$ is less than the lower voltage threshold $LL_{T1}$ at the temperature $T_1$. The voltage across the diode-connected transistor M5 gets smaller with increasing temperature and hence the lower voltage threshold $LL_{T2}$ at higher temperatures is shifted to a lower value by a potential difference $\Delta V$. The downward shift in the lower voltage threshold means that the capacitor C' must undertake a larger voltage swing between the upper and lower voltage thresholds defining the charged and discharged states. The larger voltage swing compensates for the increased charging and discharging rates such that the period of oscillation at the higher temperature is substantially the same as in the lower temperature case (i.e. the period $t_1$=the period $t_2$). That is, the oscillation frequency remains the same at the higher temperature $T_2$ as it is at the lower temperature $T_1$.

Oscillator circuits embodying the present invention can provide an oscillating waveform at frequencies which do not vary in dependence upon temperature conditions. This is achieved by employing threshold voltage setting means which can vary a voltage level at which the oscillator switches between oscillation cycles in dependence upon the temperature of the environment in which the oscillator is operating.

In the preferred embodiment a current source is implemented as a single diode-connected transistor M5. The skilled person would appreciate that while only one such diode-connected transistor is designated by reference numeral M5 two or more diode-connected transistors may be coupled together and used to facilitate larger voltage swings.

Embodiments of the present invention are not limited to the configuration of the embodiment described herein. Specifically the embodiment described herein is intended to illustrate one example of a configuration which may be used to implement the invention.

What is claimed is:

1. Oscillator circuitry comprising:
   a capacitor;
   capacitor charging means arranged to supply a current to charge the capacitor to a first predetermined threshold voltage;
   capacitor discharging means arranged to discharge the capacitor to a second predetermined threshold voltage; and
   switching means arranged to switch between a capacitor discharging mode and a capacitor charging mode responsive to reaching at least one of said threshold voltages, wherein the at least one threshold voltage is determined by a threshold setting means,
   said threshold setting means comprising a series combination of at least one diode-connected transistor and a resistor, said threshold setting means setting the second predetermined voltage to compensate for changes in temperature, so as to vary the voltage swing between said first predetermined threshold voltage and said second predetermined threshold voltage to maintain an oscillation frequency substantially independent of temperature.

2. Circuitry as claimed in claim 1, wherein the threshold setting means further comprises a current source.

3. Circuit as claimed in claim 2, wherein the threshold setting means comprises more than one diode connected transistors.

4. Circuitry as claimed in claim 1, wherein the switching means comprises a comparator arranged to monitor voltage across the capacitor and to trigger a change between the discharging and charging modes.

5. Circuitry as claimed in claim 4, wherein the comparator is connected to a first control transistor which selects the first and second predetermined threshold voltages for charging and discharging the capacitor.

6. Circuitry as claimed in claim 5, wherein the first control transistor is arranged to selectively by-pass the resistor.

7. Circuitry as claimed in claim 4, wherein the comparator is connected to a second control transistor which controls current flow to facilitate charging and discharging of the capacitor means.

8. The oscillator circuitry of claim 4, wherein a comparator output frequency is independent of temperature.

9. Circuitry as claimed in claim 1, wherein the capacitor charging means comprises a current source.

10. Circuitry as claimed in claim 1, wherein the capacitor discharging means comprises a current source.

11. Oscillator circuitry comprising:
    a capacitor;
    a capacitor charger arranged to supply a current to charge the capacitor to a first predetermined threshold voltage;
    a capacitor charger arranged to discharge the capacitor to a second predetermined threshold voltage; and
    a switch arranged to switch between a capacitor discharging mode and a capacitor charging mode responsive to reaching at least one of said threshold voltages, wherein the at least one threshold voltage is determined by a series combination of at least one diode-connected transistor and a resistor, said combination setting the second predetermined voltage to compensate for changes in temperature so as to vary the voltage swing between said first predetermined threshold voltage and said second predetermined threshold voltage to maintain an oscillation frequency substantially independent of temperature.

12. The oscillator circuitry of claim 1, wherein a charge and discharge frequency of the capacitor is independent of temperature.

13. The oscillator circuitry of claim 11, wherein the series combination further comprises a current source.

14. The oscillator circuitry of claim 13, wherein the resistive comprises more than one diode connected transistors.

15. The oscillator circuitry of claim 11, wherein the switch comprises a comparator arranged to monitor voltage across the capacitor and a trigger a change between the discharging and charging modes.

16. The oscillator circuitry of claim 15, wherein the comparator is connected to a first control transistor which selects the first and second predetermined threshold voltages for charging and discharging the capacitor.

17. The oscillator circuitry of claim 16, wherein the first control transistor is arranged to selectively by-pass the resistor.

18. The oscillator circuitry of claim 15, wherein the comparator is connected to a second control transistor which controls current flow to facilitate charging and discharging of the capacitor.

19. The oscillator circuitry of claim 15, wherein a comparator output frequency does not vary with temperature.

20. The oscillator circuitry of claim 11, wherein the capacitor charger comprises a current source.

21. The oscillator circuitry of claim 11, wherein the capacitor discharger comprises a current source.

22. The oscillator circuitry of claim 11, wherein a charge and discharge frequency of the capacitor is independent of temperature.

23. A method of providing an oscillating voltage signal, the method comprising the acts of:

increasing a voltage signal until the voltage signal reaches a first threshold voltage; decreasing the voltage signal until the voltage signal reaches a second threshold voltage; and varying a difference between the first threshold voltage and the second threshold voltage, wherein the second predetermined voltage is determined by a series combination of at least one diode-connected transistor and a resistor, the second predetermined voltage is varied in response to changes in temperature to maintain an oscillation frequency substantially independent of temperature.

24. The method of claim 23, wherein the act of increasing the voltage signal includes an act of increasing the voltage signal at a rate that varies with temperature.

25. The method of claim 23, wherein the act of decreasing the voltage signal includes an act of decreasing the voltage signal at a rate that varies with temperature.

26. The method of claim 23, wherein the act of increasing the voltage signal includes an act of charging a capacitor.

27. The method of claim 23, wherein the act of decreasing the voltage signal includes an act of discharging a capacitor.

* * * * *

UNITED STATES PATENT AND TRADEMARK OFFICE
CERTIFICATE OF CORRECTION

PATENT NO. : 6,891,443 B2
DATED : April 26, 2005
INVENTOR(S) : Jean-Michel Ravon It is certified that error appears in the above-identified patent and that said Letters Patent is hereby corrected as shown below:

Column 1,
Line 13, should read -- lation frequency can decrease with temperature. --

Column 2,
Line 65, should read -- M2 bypasses (shorts out) the third resistor R3, the voltage $V_2$ at --

Column 5,
Line 65, should read -- Circuitry as claimed in claim 2, wherein the threshold --

Column 6,
Line 45, should read -- resistive means comprises more than one diode connected transis --
Line 49, should read -- the capacitor and to trigger a change between the discharging --

Signed and Sealed this

Twelfth Day of July, 2005

JON W. DUDAS
*Director of the United States Patent and Trademark Office*